US007009463B2

(12) United States Patent
Boulerne

(10) Patent No.: US 7,009,463 B2
(45) Date of Patent: Mar. 7, 2006

(54) HARMONIC REFLECTIVE LOAD-PULL TUNER

(75) Inventor: Philippe Boulerne, Montreal (CA)

(73) Assignee: Boulerne Philippe, Montreal (CA)

(*) Notice: Subject to any disclaimer, the term of this patent is extended or adjusted under 35 U.S.C. 154(b) by 0 days.

(21) Appl. No.: 10/903,844

(22) Filed: Aug. 2, 2004

(65) Prior Publication Data

US 2006/0022776 A1 Feb. 2, 2006

(51) Int. Cl.
*H03H 7/38* (2006.01)
*G01R 27/00* (2006.01)

(52) U.S. Cl. ...................... 333/17.3; 333/263; 324/642

(58) Field of Classification Search .................. 324/76, 324/49, 76.11, 76.51, 642; 333/17.3, 263
See application file for complete search history.

(56) References Cited

U.S. PATENT DOCUMENTS 6,674,293 B1 * 1/2004 Tsironis ...................... 324/638
6,850,076 B1 * 2/2005 Tsironis ...................... 324/637

OTHER PUBLICATIONS

Browne, "Coaxial Tuners Control Impedances to 65 GHz", Jan. 2003, Microwaves and RF.*
Cusack et al., "Automatic Load Contour Mapping for Microwave Power Transitors", 1974, IEEE Transactions on Microwave Theory and Techniques, vol. MTT-22, No. 12, pp. 1146-1150.*

* cited by examiner

*Primary Examiner*—Stephen E. Jones

(57) ABSTRACT

The present invention discloses a harmonic reflective tuner system consisting of a radio-frequency (RF) or microwave transmission line having a longitudinal axis, containing two harmonic resonators sliding on the central conductor, where the harmonic resonators are comprising a pair of identical RF slugs, mechanically attached together. The two harmonic resonators will reflect two harmonic frequencies of a base frequency F0. The harmonic reflective tuner of this invention has an input and output, said input being connected to the DUT trough a diplexer in parallel with the fundamental tuner.

4 Claims, 8 Drawing Sheets

PRIOR ART

PRIOR ART

PRIOR ART FIGURE 4B

PRIOR ART

HARMONIC REFLECTIVE LOAD-PULL TUNER

CROSS REFERENCE TO RELATED APPLICATIONS

U.S. Patent Documents

| | | | |
|---|---|---|---|
| 3851271 | November, 1974 | Cooke et al. | 331/47 |
| 4267532 | May, 1981 | Saleh | 333/33 |
| 4535307 | August, 1985 | Tsukii | 333/35 |
| 4751480 | June, 1988 | Kunz et al. | 333/129 |
| 5079507 | January, 1992 | Ishida et al. | 324/645 |
| 5363060 | November, 1994 | Kohno | 330/286 |
| 5406224 | April, 1995 | Mikami et al. | 330/277 |
| 6297649 | Oct. 2, 2001 | Tsironis | 324/642 |
| 6674293 | Jan. 6, 2004 | Tsironis | 324/638 |

OTHER REFERENCES

LANGE Julius, Microwave Transistor Characterization Including S-Parameters, Texas Instruments, in Hewlett Packard Application Note 95

KESHISHIAN Richard, VSWR Tuner, MACOM Application Note AN0004

CUSACK Joseph M., PERLOW Stewart M., PERLMAN Barry S., Automatic Load Contour Mapping for Microwave Power Transistors; IEEE Transactions on Microwave Theory and Techniques, vol. MMT-22, No. 12, December 1974, pp1146–1152.

SECHI F., PAGLIONE R., PERLMAN B., BROWN J., A Computer-Controlled Microwave Tuner for Automated Load Pull, RCA Review, vol. 44 Dec. 1983, pp 566–583.

PERLOW Stewart M., New Algorithms for the Automated Microwave Tuner System, RCA Review, vol. 46, September 1985, pp 341–355.

Patent Application Publication, U.S. 2003/0122633 A1, Jul. 3, 2003, Christos Tsironis, “High Frequency, High Reflection Pre-Matching Tuners with Variable Zero Initialization”

Patent Application Publication, U.S. 2004/0119481 A1, Jun. 24, 2004, Christos Tsironis, “Microwave Tuners for Wideband High Reflection Applications”

STATEMENT REGARDING FEDERALLY SPONSORED RESEARCH OR DEVELOPMENT

Not Applicable

REFERENCE TO A SEQUENCE LISTING A TABLE, OR A COMPUTER PROGRAM LISTING COMPACT DISK APPENDIX

Not Applicable

BACKGROUND OF THE INVENTION

1. Field of the Invention

The present invention relates to an electromechanical harmonic reflective tuner system, and more particularly to such a system to be used in harmonic load-pull setup for the measurement, characterization and testing of RF or microwave devices. Under high power conditions at its input at the fundamental frequency F0, the device under test (hereinafter referred to as “DUT”) generates an output signal that contains the fundamental frequency F0 and the harmonic frequencies of said fundamental frequency F0. RF/Microwave harmonic reflective tuners are electronic devices or mechanical devices which modify in a predictable way the phase of the reflection of harmonics of a given operation frequency F0. The harmonic reflective tuner has the capability of generating high amplitude gamma to the microwave devices at harmonic frequencies. This technique of subjecting DUT’s input and output to variable high gamma phase with corresponding harmonic source tuner and harmonic load tuner, commonly referred to as “harmonic load pull”, is used to test transistors for amplifier, oscillator or frequency multiplier applications specially at high power, when the non-linear effect of the DUT produces harmonic frequencies.

2. Description of Prior Art

The harmonic load-pull setup is composed of an input generator and its associated amplification (4) connected to input tuners, DUT (3), output tuners and the appropriated measurement apparatus (5).

One possible configuration for harmonic load-pull is using frequency discriminators like triplexers at the input of the DUT (7) and at the output of the DUT (7') shown in FIG. 1 and using large band tuners (6) on all frequency branches, the large band tuners on the harmonic branches being terminated by 50 ohms loads (2) connected to ground (1). With the large band tuners, the impedances at all frequencies at the input and output of the DUT can be controlled independently. The disadvantage of this method lies in the losses of the triplexer, its limited frequency bandwidth and the high number of large band tuners required, 6 in the configuration of FIG. 1.

In order to obviate these problems, a specific harmonic tuner has been proposed in U.S. Pat. No. 6,297,649 issued to Christos TSIRONIS Oct. 2, 2001. Dedicated harmonic tuners are inserted in series between the fundamental tuner (6,6') and the DUT’s (3) at the input, harmonic tuner (8), and at the output, harmonic tuner (8'). These harmonic tuners are comprising a transmission line (9) on which 2 open stubs (11,12) are sliding on the central conductor (10), which open stubs are surrounded by a circular side wall (14,14') and permanently secured on the said side walls through dielectric, low loss washers (13,13'). In order to eliminate the residual reflection at the fundamental frequency F0, additional open stubs (11',12') might be added, said additional open stubs are identical to the first open stubs (11,12). The open stubs are then positioned along the transmission line to control the phase of the reflection as indicated by arrows (11") and (12").

The advantages of this harmonic tuner are:

The number of tuners has been reduced to 2.

These tuners are easier to manufacture than fundamental tuner since they do only require 2 horizontal translation control of the resonators along the transmission line longitudinal axis in order to control the phase reflection at harmonic frequencies.

The disadvantages of this harmonic tuner are:

Stub copper foil sliding on the central conductor with a metallic to metallic contact in order to insure “perfect” galvanic contact to minimize the losses and to increase the band rejection will see these performances significantly degraded with long term use, because of the removal of the gold metallization of the central conductor, therefore decreasing the band rejection and increasing the losses.

Since the harmonic tuner of U.S. Pat. No. 6,297,649 (8,8') is inserted in series between the DUT (3) and the fundamental tuner (6,6'), a supplementary constraint on the harmonic reflectors is that they have to be transparent at the fundamental frequency F0.

Since the harmonic tuner of U.S. Pat. No. 6,297,649 (8,8') is inserted in series between the DUT (3) and the fundamental tuner (6,6'), the losses of the harmonic tuner at the fundamental frequency F0 are directly degrading the performances of the fundamental tuner (6,6'), lowering the gamma tuning range of the fundamental tuners.

Since the harmonic tuner of U.S. Pat. No. 6,297,649 (8,8') is inserted in series between the DUT (3) and the fundamental tuner (6,6'), the RF isolation at the fundamental frequency F0 is very poor, meaning that any modifications of the position of the harmonic resonators will affect the impedance seen by the DUT at this fundamental frequency F0 and has to be corrected.

BRIEF SUMMARY OF THE INVENTION

The problem remaining in the prior art has been solved in accordance with the present invention which relates to a class of mechanical harmonic reflective tuner comprising a transmission line, two harmonic resonators sliding along the transmission line longitudinal axis. Since the setup is using a diplexer in order to separate the fundamental frequencies F0 from the harmonic frequencies nF0, the isolation of the fundamental tuning compare to the harmonic tuning is very good by design, the harmonic resonators do not have to be transparent at the fundamental frequency F0 and finally just the losses of the diplexer are affecting the gamma tuning range of the fundamental tuner at F0, said diplexers are much easier to manufacture than triplexers.

BRIEF DESCRIPTION OF THE SEVERAL VIEWS OF THE DRAWING

FIG. 4B: Prior Art: depicts a double-double-stub harmonic tuner—longitudinal cross sectional view.

DETAILED DESCRIPTION OF THE INVENTION

Figure 1:
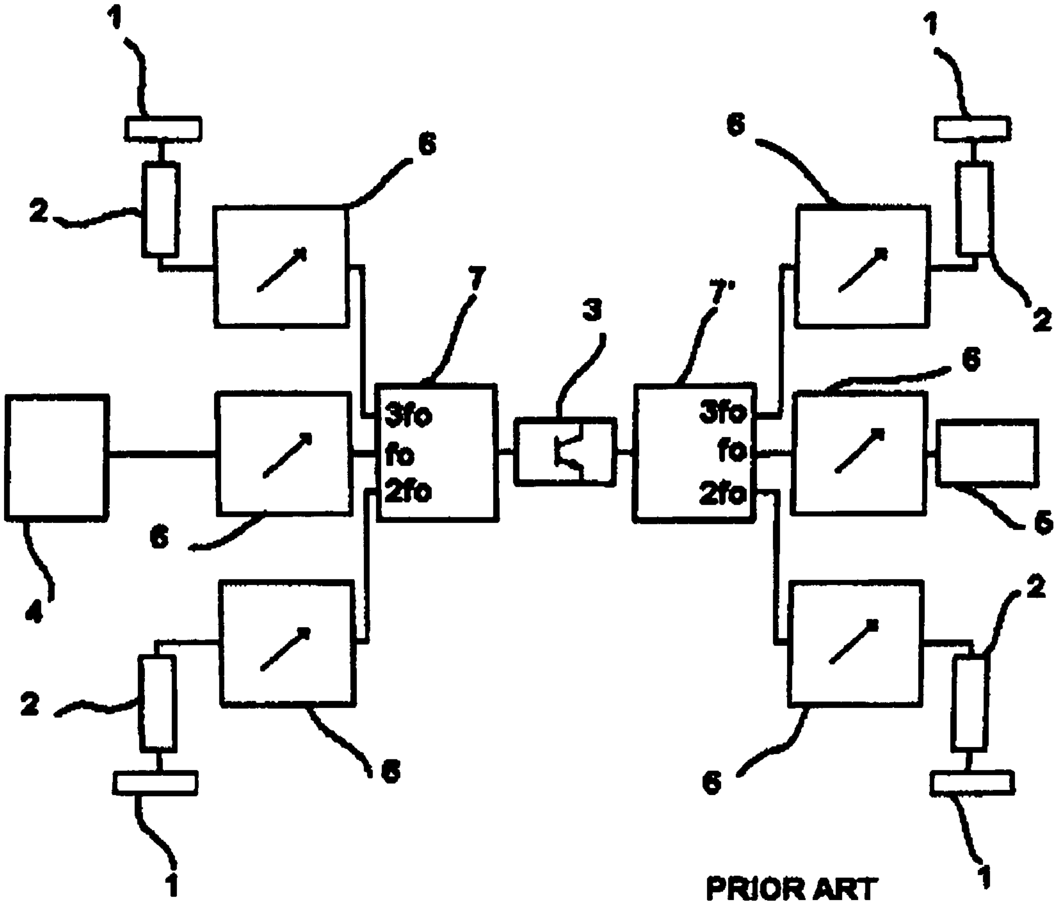
FIG. 1: Prior Art: depicts a harmonic load-pull setup using triplexer and fundamental tuners
Figure 2:
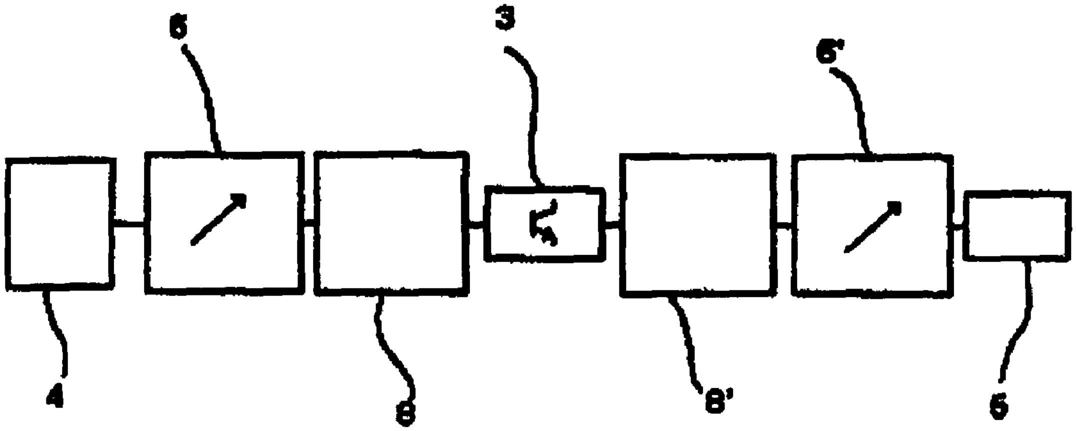
FIG. 2: Prior Art: depicts a harmonic load-pull setup using dedicated double-stub harmonic tuner in series between the fundamental tuners and the DUT
Figure 3A:
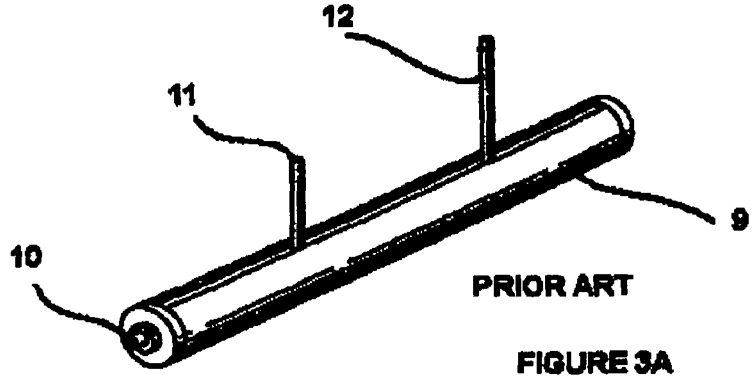
PRIOR ART FIGURE 3A
FIG. 3A: Prior Art: depicts a double-stub harmonic tuner
Figure 3B:
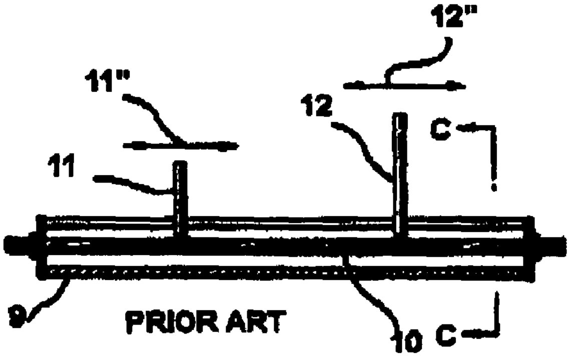
FIGURE 3B PRIOR ART
FIG. 3B: Prior Art: depicts a double-stub harmonic tuner—longitudinal cross sectional view.
Figure 3C:
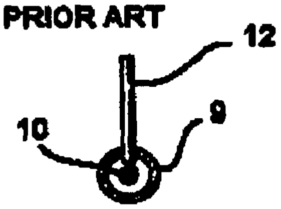
FIG. 3C: Prior Art: depicts a double-stub harmonic tuner—transversal cross sectional view.
Figure 3D:
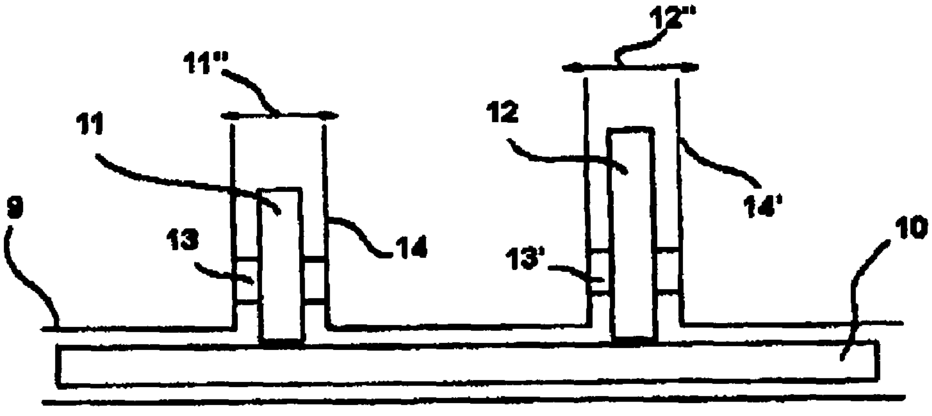
PRIOR ART FIGURE 3D
FIG. 3D: Prior Art: depicts a double-stub harmonic tuner—schematic longitudinal cross sectional view.
Figure 4A:
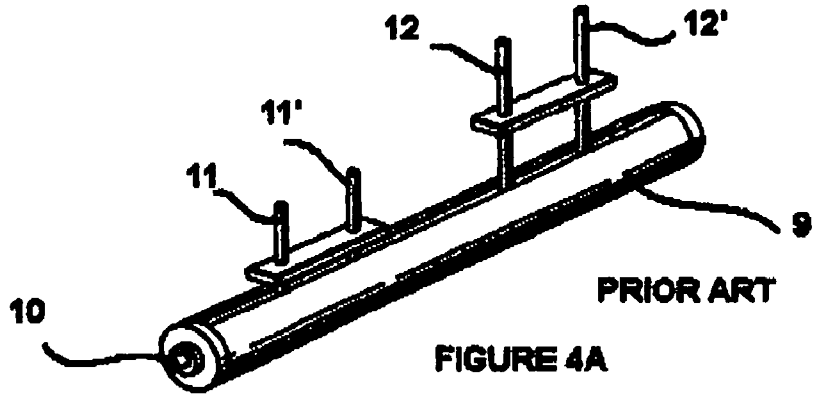
PRIOR ART FIGURE 4A
FIG. 4A: Prior Art: depicts a double-double-stub harmonic tuner
Figure 4C:
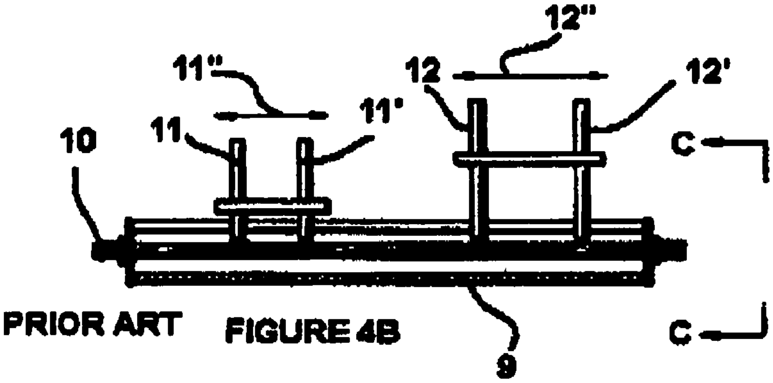
FIG. 4C: Prior Art: depicts a double-double-stub harmonic tuner—transversal cross sectional view.
Figure 4C:
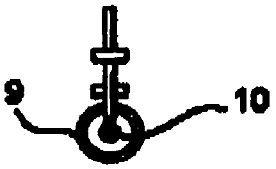
Figure 4D:
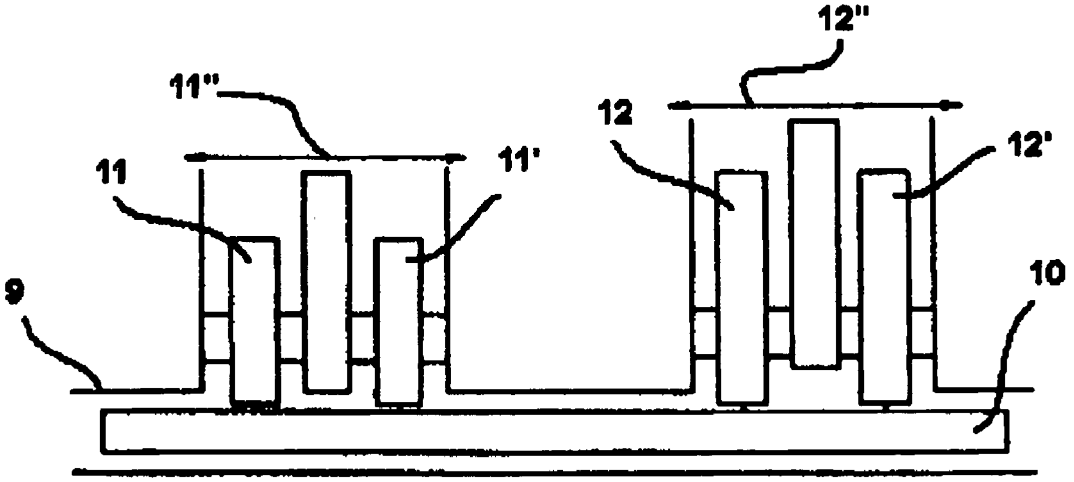
PRIOR ART FIGURE 4D
FIG. 4D: Prior Art: depicts a double-double-stub harmonic tuner—schematic longitudinal cross sectional view.
Figure 5:
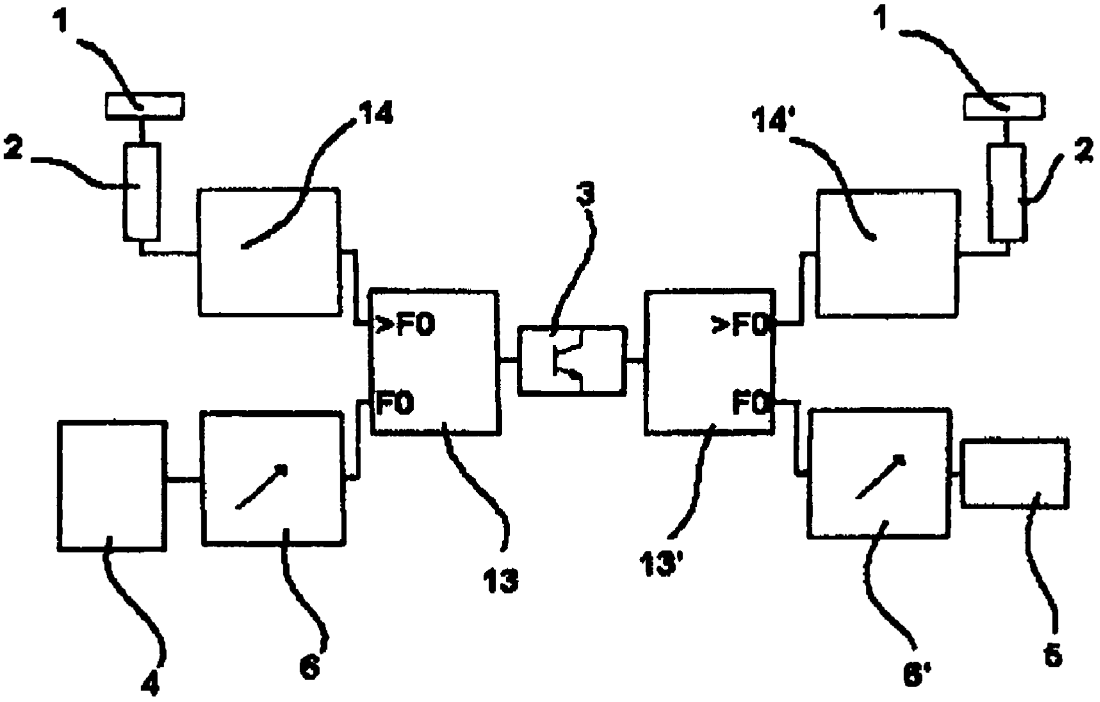
FIG. 5: Depicts a harmonic load-pull setup using diplexer with harmonic reflective tuner

The measurement setup for the harmonic tuner of this invention is described by FIG. 5. The harmonic load-pull setup is composed of an input generator and its associated amplification (4) connected in series to the input wide band tuner (6), input diplexer (13), DUT (3), output diplexer (13'), output wide band tuner (6') and the appropriated measurement apparatus (5), such as spectrum analyser, power meter or standard load. The harmonic tuners of this invention are placed in parallel with the DUT's input and output, the input harmonic tuner (14) being connected to the input diplexer (13), and the output harmonic tuner (14') being connected to the output diplexer (13'). The diplexers have one input and two outputs, discriminating the fundamental frequency F0 on one branch, from the frequencies above F0 (harmonics of F0) on the other branch where the harmonic tuners are connected.

Figure 8:
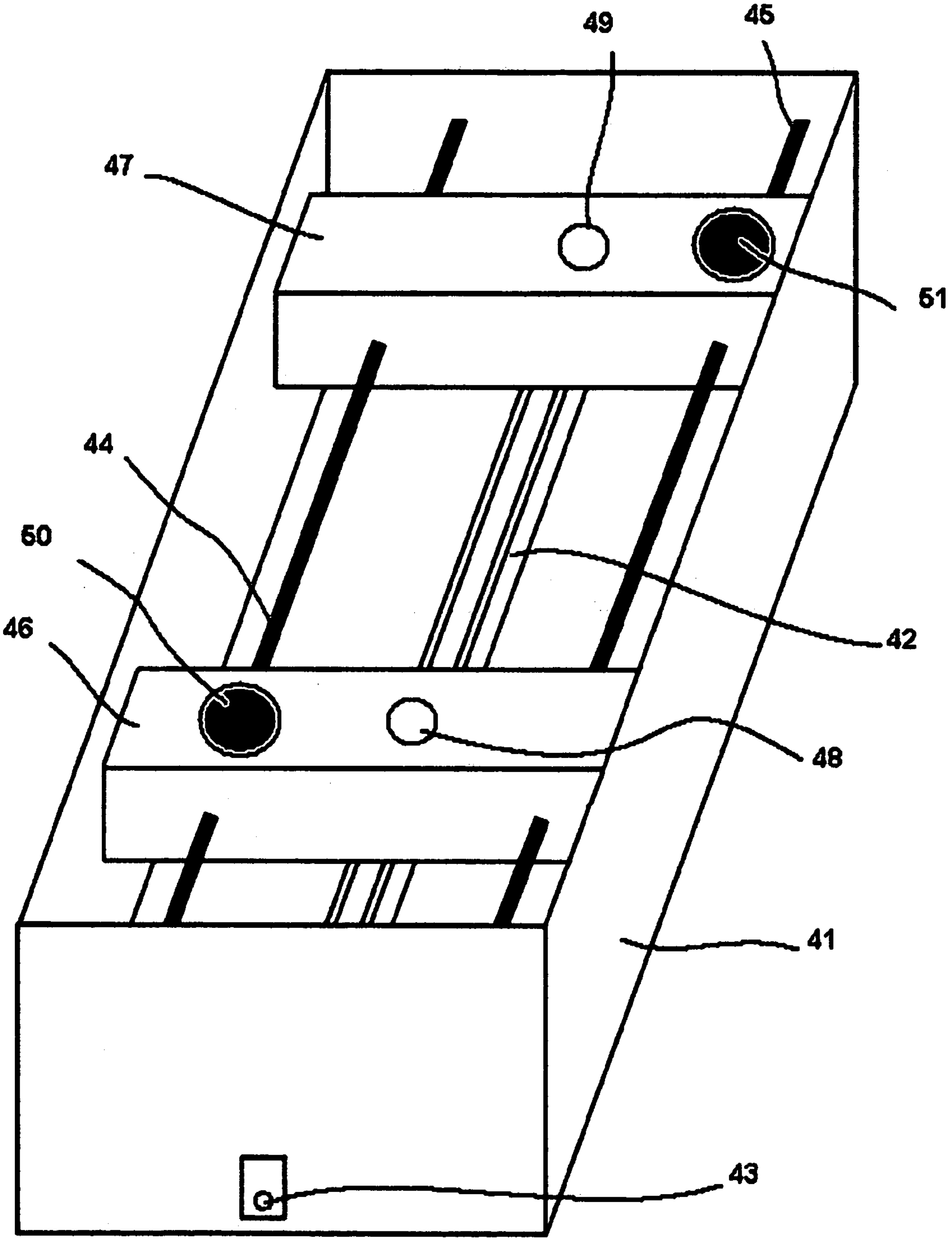
FIG. 8: Depicts a preferred embodiment of the harmonic reflective tuner structure

The harmonic reflective tuner, described by FIG. 8, consists of a housing (41), a slab-line (42,15) with a characteristic impedance Z0. The slab-line contains two harmonic resonators (19,20,23,24), that slide between the inner (16) and outer (42,15) conductors. In a preferred embodiment of this invention, the harmonic resonators (19,20) include a pair of identical wide band RF slugs equal in sizes and materials, each pair of slugs being mechanically linked to a mobile carriage (46,47) trough a mechanical link (48,49). The harmonic resonators are horizontally positioned in the slab-line by mobile carriages (46,47), which are driven by two lateral mechanisms such as driving screws (44,45), which themselves are controlled by stepping motors (50,51). Both harmonic resonators are sliding on the central conductor of the slab-line.

The purpose of the harmonic tuners is to reflect back to the DUT with appropriate phase angle the harmonic frequencies of a fundamental frequency F0 produced by the DUT itself under non-linear conditions. The way this invention is accomplishing the reflection of the two harmonic frequencies is by using the maximum VSWR (Voltage Standing Wave Ratio) resonant property of a pair of quarter wavelength low impedance RF slugs, a quarter wavelength spaced apart. A second harmonic resonator is placed in series with the first harmonic resonator, said first harmonic resonator being transparent to the resonant frequency of the second harmonic resonator by using the transparent property of half wavelength low impedance RF slugs.

Figure 6A:
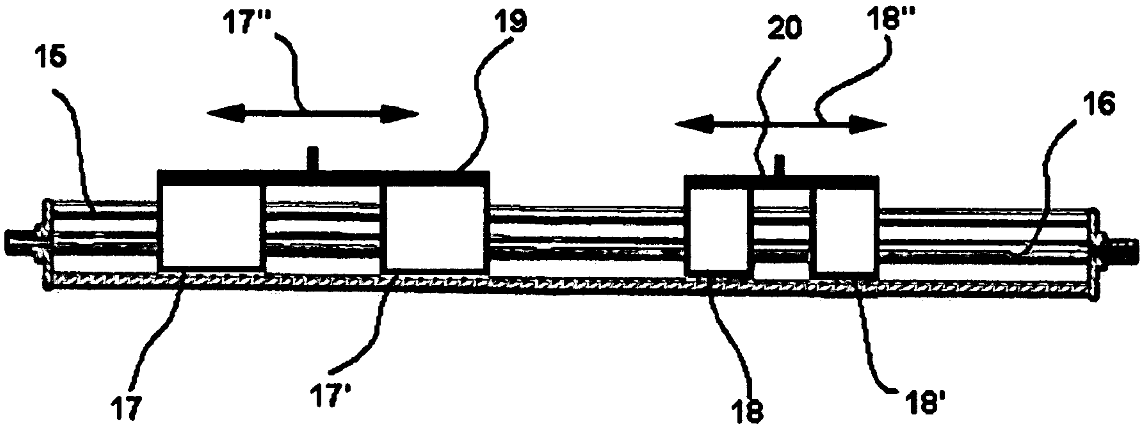
FIG. 6A: Depicts a harmonic reflective tuner slab-line with 2 RF slugs mechanically linked together: longitudinal cross sectional view
Figure 6B:
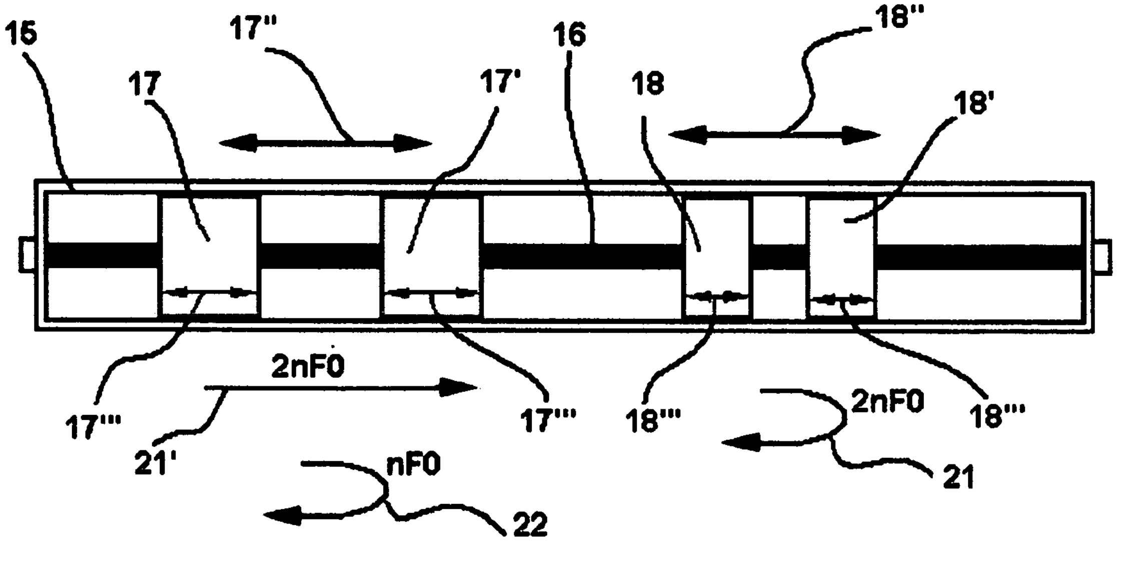
FIG. 6B: Depicts a harmonic reflective tuner slab-line with 2 RF slugs mechanically linked together: top view

In a first preferred embodiment of this invention, the harmonic resonators described by FIG. 6A are comprising two low impedance wide band RF slugs (17,17') or (18,18') apart from each other and mechanically attached together (19) or (20).

The maximum reflection VSWR of the first harmonic resonator comprising slug (17) and slug (17') at harmonic frequency nF0 will occur when the RF slugs spacing is an odd multiple of a quarter wavelength of the harmonic frequency nF0 and said slugs (17,17') longitudinal lengths are also an odd multiple of the quarter wavelength of the harmonic frequency nF0. The harmonic frequency nF0 will be reflected back to the DUT as depicted by arrow (22).

At twice the harmonic frequency nF0, i.e. 2 nF0, the RF slugs (17,17') will be half a wavelength long and therefore transparent, letting the harmonic frequency 2 nF0 to go through the RF slugs (17,17') as depicted by arrow (21').

The maximum reflection VSWR of the second harmonic resonator comprising slug (18) and slug (18') at harmonic frequency 2 nF0 will occur when the RF slugs spacing is an odd multiple of a quarter wavelength of the harmonic frequency 2 nF0 and said slugs (18,18') longitudinal lengths are also an odd multiple of the quarter wavelength of the harmonic frequency 2 nF0. The harmonic frequency 2 nF0 will be reflected back to the DUT as depicted by arrow (21).

In order to control the phase angle of the reflection, the harmonic resonators are moveable along the longitudinal axis of the transmission line (15), as shown by arrows (17") and (18"). An appropriate motor driven mechanism (50,51) ensures the controlled smooth travel of the harmonic resonators (19,20,23,24) along the longitudinal axis of the transmission line (15) and thus the control of the phase reflection generated by the harmonic resonators.

Figure 7:
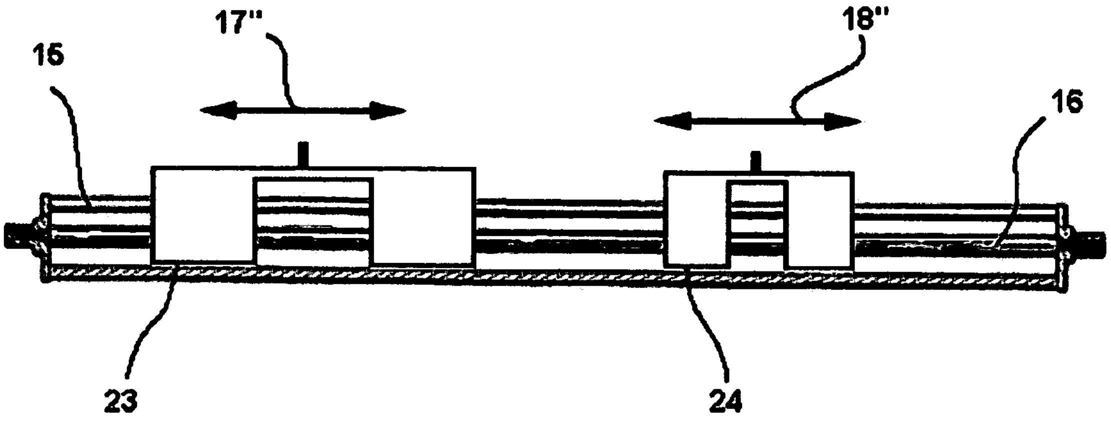
FIG. 7: Depicts a harmonic reflective tuner slab-line with a single corrugated RF slug with one slot: longitudinal cross sectional view

In a second preferred embodiment of the invention, the harmonic resonators are corrugated slugs (23) and (24) as shown by FIG. 7. The corrugated RF slugs with one slot which longitudinal length is equals to the two peaks longitudinal length, said longitudinal length being equal to quarter wavelength of the harmonic frequency being reflected by the resonator, said slot being arranged in a direction perpendicular to the longitudinal axis of the transmission line.

Practically however, the harmonic reflective tuner of the present invention will be supplied as a kit with a plurality of harmonic resonators. Each resonator will have a longitudinal length adapted to reflect out the harmonic frequency of a given frequency F0.

Finally, expressions such as "equal" and "identical" have been used in the present description and in the following claims. However, it will be understood that these expressions, and other like them, are used in the context of theoretical calculations, but in practice mean "as close as possible" to the theory.

Although the present invention has been explained hereinabove by way of a preferred embodiment thereof, it should be pointed out that any modifications to this preferred embodiment within the scope of the appended claims is not deemed to alter of change the nature and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. An electromechanical harmonic reflective tuner having an input and an output, comprising a transmission line with longitudinal axis, in which two harmonic resonators are sliding along said transmission line by means of electrical remote control, each of said harmonic resonators are comprising 2 identical wide band RF slugs longitudinally spaced apart win a fixed longitudinal distance identical to said wide band RF slugs longitudinal lengths, first harmonic resonator being transparent to the maximum VSWR resonant frequency of the second harmonic resonator.

2. An electromechanical harmonic reflective tuner as in claim 1, wherein said first harmonic resonator has wide band RF slugs of longitudinal lengths equal to $\lambda/2$ of said second harmonic resonator maximum VSWR resonant frequency.

3. An electromechanical harmonic reflective tuner as in claim 1, wherein said second harmonic resonator has wide band RF slugs of longitudinal length equal to $\lambda/4$ of said second harmonic resonator maximum VSWR resonant frequency.

4. An electromechanical harmonic reflective tuner as in claim 1, wherein said electrical remote control comprises two electrical motors for the parallel movement of said two harmonics resonators along said longitudinal axis of said transmission line.

* * * * *